United States Patent
Ybarra et al.

(10) Patent No.: US 10,835,919 B2
(45) Date of Patent: Nov. 17, 2020

(54) SPIN CHUCK JIG AND METHOD OF LIFTING SPIN CHUCK USING THE SAME

(71) Applicant: Samsung Electronics Co., Ltd., Suwon-si, Gyeonggi-do (KR)

(72) Inventors: Michael D. Ybarra, Pflugerville, TX (US); Elijah L. Rhoades, Pflugerville, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 32 days.

(21) Appl. No.: 16/046,988

(22) Filed: Jul. 26, 2018

(65) Prior Publication Data

US 2020/0030842 A1    Jan. 30, 2020

(51) Int. Cl.
| | | |
|---|---|---|
| *B65G 7/12* | (2006.01) | |
| *H01L 21/68* | (2006.01) | |
| *B05C 13/02* | (2006.01) | |
| *B23B 31/39* | (2006.01) | |

(52) U.S. Cl.
CPC .............. *B05C 13/02* (2013.01); *B23B 31/39* (2013.01); *B65G 7/12* (2013.01); *H01L 21/68* (2013.01)

(58) Field of Classification Search
CPC ........... B05C 11/00; B05C 12/02; B65G 7/11; B65G 7/12; Y10T 279/3418; Y10T 279/35; B25B 11/02; H01L 21/68; Y10S 279/901; B23B 31/39
USPC ................................................. 279/124, 158
See application file for complete search history.

(56) References Cited

U.S. PATENT DOCUMENTS

| | | | | |
|---|---|---|---|---|
| 669,204 A | * | 3/1901 | Legault .................... | B65G 7/12 294/15 |
| 2010/0072687 A1 | * | 3/2010 | Shinkai ................... | B23Q 3/062 269/40 |
| 2015/0336127 A1 | | 11/2015 | Emory et al. | |

FOREIGN PATENT DOCUMENTS

| | | |
|---|---|---|
| JP | H10270318 A | 10/1998 |
| KR | 20120057964 A * | 6/2012 |
| WO | 2015029563 A1 | 3/2015 |

* cited by examiner

*Primary Examiner* — Sunil K Singh
*Assistant Examiner* — Paul M Janeski
(74) *Attorney, Agent, or Firm* — Renaissance IP Law Group LLP

(57) ABSTRACT

A spin chuck jig includes a handle having first holes, a base having second holes, wherein a number of the second holes and a number of first holes are the same, and bolts each penetrating one of the first holes and one of the second holes so that the handle and the base are attached to a spin chuck to be lifted from a spin process equipment.

10 Claims, 6 Drawing Sheets

SPIN CHUCK JIG AND METHOD OF LIFTING SPIN CHUCK USING THE SAME

TECHNICAL FIELD

The present inventive concept relates to a spin chuck jig and a method of lifting a spin chuck using the same.

DISCUSSION OF RELATED ART

Wafers to be processed in semiconductor fabrication apparatuses are getting larger in size for higher throughput of a unit process, and it is difficult to perform a maintenance operation on the apparatuses due to their parts getting bigger and heavier. For a single-wafer wet-spin process equipment for a wet cleaning process or a wet etching process, for example, maintenance of the apparatus entails disassembly of a spin chuck system. To separate the spin chuck from the equipment, maintenance engineers may use two screw driver-shaped tools to lift the spin chuck in awkward hand positioning. Those tools do not provide enough gripping area, they place undue stress on the engineers' hands/arms when lifting, they do not allow for spin chuck orientation, and the screw driver-shaped tools remain very susceptible to bending and snapping.

If the engineers lose the hand grip on these small screw driver-shaped tools, the entire spin chuck may drop inside or outside the equipment which may cause mechanical damage and/or personnel injury.

SUMMARY

According to an exemplary embodiment of the present inventive concept, a spin chuck jig includes a handle having a plurality of first holes, a base having a plurality of second holes, wherein a number of the plurality of second holes and a number of the plurality of first holes are the same, and a plurality of bolts each penetrating one of the plurality of first holes and one of the plurality of second holes so that the handle and the base are attached to a spin chuck to be lifted from a single-wafer wet-spin process equipment.

According to an exemplary embodiment of the present inventive concept, a method of lifting a spin chuck from a single-wafer wet-spin process equipment is provided as follows. A base having a plurality of second holes is inserted into a recessed region of the spin chuck. A handle having a plurality of first holes is placed on a top surface of the base. Each of a plurality of bolts is inserted into one of the plurality of first holes and one of the plurality of second holes to attach the base and the handle to the spin chuck. The spin chuck is lifted using the handle.

BRIEF DESCRIPTION OF DRAWINGS

These and other features of the present inventive concept will become more apparent by describing in detail exemplary embodiments thereof with reference to the accompanying drawings of which.

Figure 1:
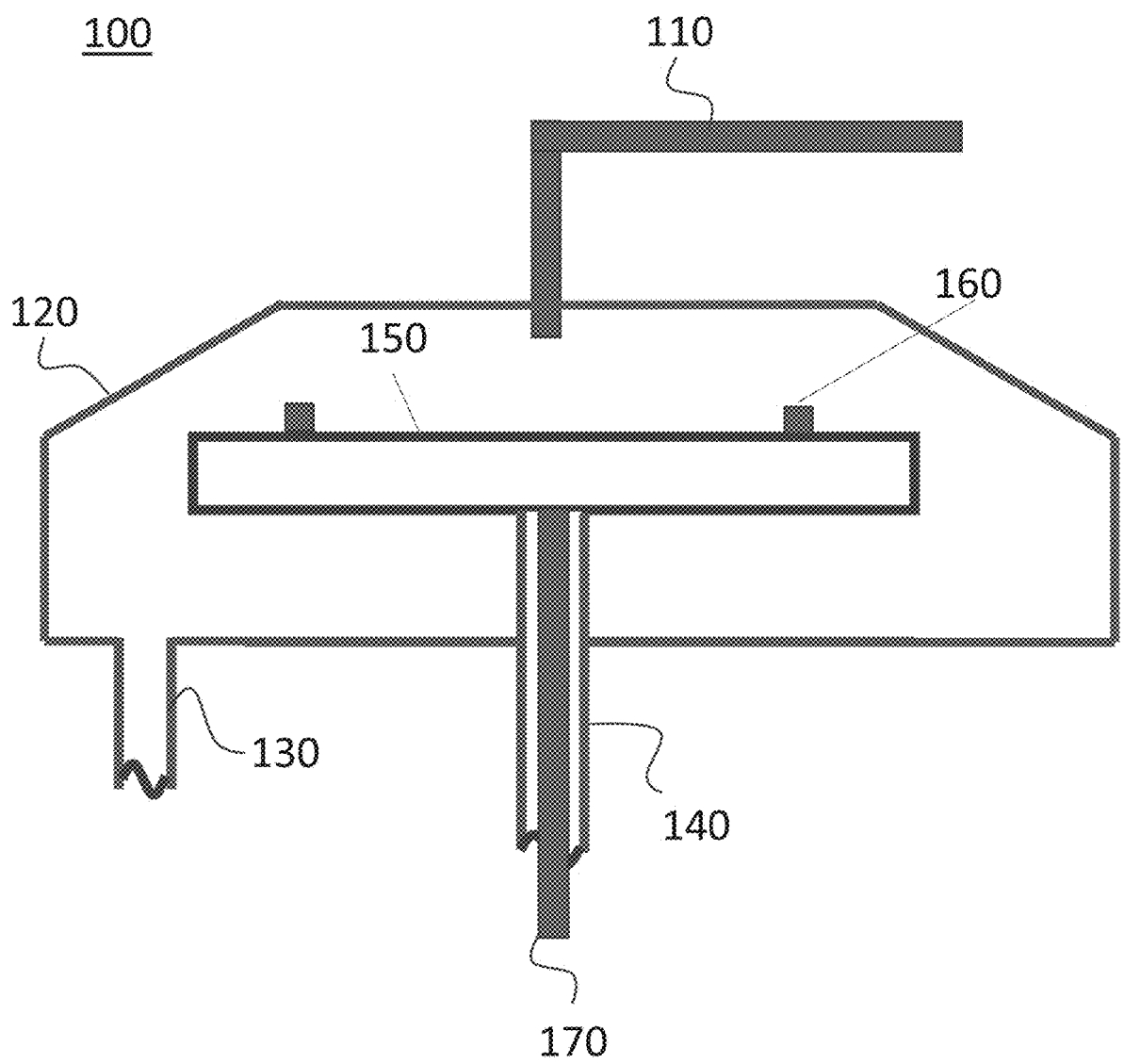
FIG. 1 shows a single-wafer wet-spin process equipment according to an exemplary embodiment of the present inventive concept.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein.

FIG. 1 shows a single-wafer wet-spin process equipment according to an exemplary embodiment of the present inventive concept.

A single-wafer wet-spin process equipment 100 includes a front-side dispenser 110, a housing 120, an outlet 130, a rotating shaft 140, a spin chuck 150, wafer chuck pins 160, and a back-side dispenser 170. In an exemplary embodiment, the single-wafer wet-spin process equipment 100 may perform a wet cleaning process or a wet etch process on a single wafer. To increase a manufacturing throughput, a wafer with a large diameter is used. For example, the wafer may be 450 mm in diameter. As such, the spin chuck 150 increases in diameter to hold the wafer. In regular maintenance of the single-wafer wet-spin process equipment 100, maintenance engineers remove the spin chuck 150 from the single-wafer wet-spin process equipment 100. As the diameter of the spin chuck 150 increases, the engineers may experience personal injury or handling errors when lifting the spin chuck 150 from the single-wafer wet-spin process equipment 100 with existing tools.

The front-side dispenser 110 may supply a chemical solution for etch or cleaning, de-ionized (DI) water or a nitrogen gas to a wafer on the spin chuck 150 that rotates at a predetermined speed.

In maintenance, the rotating shaft 140 stops and the spin chuck 150 may be released from the rotating shaft 140.

The spin chuck 150 may engage the rotating shaft 140 in operation, thereby rotating to the rotation speed of the rotating shaft 140. In maintenance, the spin chuck 150 may be released from the rotating shaft 140 so that maintenance engineers can lift the spin chuck 150 from the single-wafer wet-spin process equipment 100. For the convenience of a description, various mechanical constituents between the spin chuck 150 and the rotating shaft 140 may be omitted.

The rotating shaft 140 may have a hollow inside to accommodate the back-side dispenser 170. The wafer placed on the wafer chuck pins 160 may be spaced apart from a top surface of the spin chuck 150 and thus the chemical solution, the DI water and the nitrogen gas may be supplied to the back-side of the wafer through the back-side dispenser 170.

Figure 2:
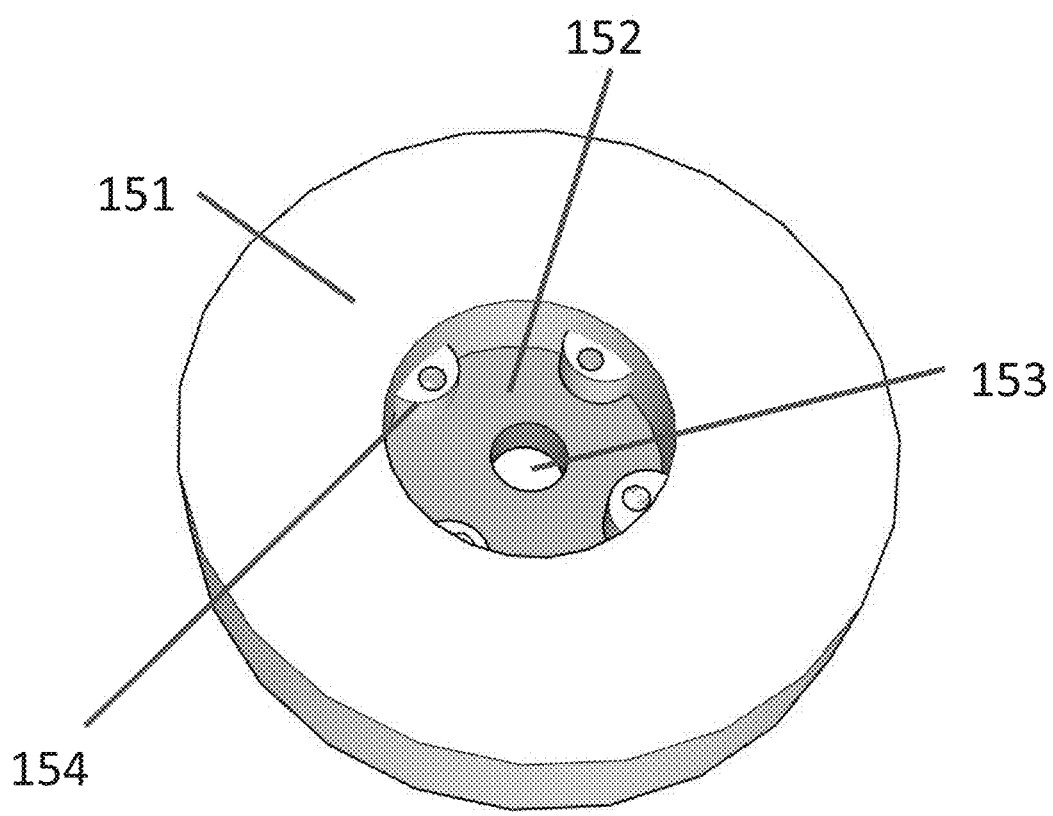
FIG. 2 shows a perspective view of a spin chuck of FIG. 1 according to an exemplary embodiment of the present inventive concept.

FIG. 2 shows a perspective view of a spin chuck of FIG. 1 according to an exemplary embodiment of the present inventive concept. More specifically, FIG. 2 shows the spin chuck 150 separated from the single-wafer wet-spin process equipment 100 of FIG. 1.

The spin chuck 150 includes a wafer holder 151, a recessed region 152, a connecting hole 153 and a plurality of bolt receptors 154.

Only the wafer chuck pins 160 serve to hold the wafer which do attach the spin chuck body.

The recessed region 152 may serve to accommodate a base of a spin chuck jig, which will be described with reference to FIG. 3. At the bottom of the recessed region 152, the bolt receptors 154 are disposed along an inner sidewall of the recessed region 152. The bolt receptors 154 may serve to receive bolts of the spin chuck jig so that maintenance engineers can lift the spin chuck 150 with the spin chuck jig.

The spin chuck 150 and the rotating shaft 140 are engaged to each other through the connecting hole 153 when the single-wafer wet-spin process equipment is in operation. In operation, a chemical solution for a wet cleaning process or a wet etch process may be supplied through the connecting hole 153.

Figure 3:
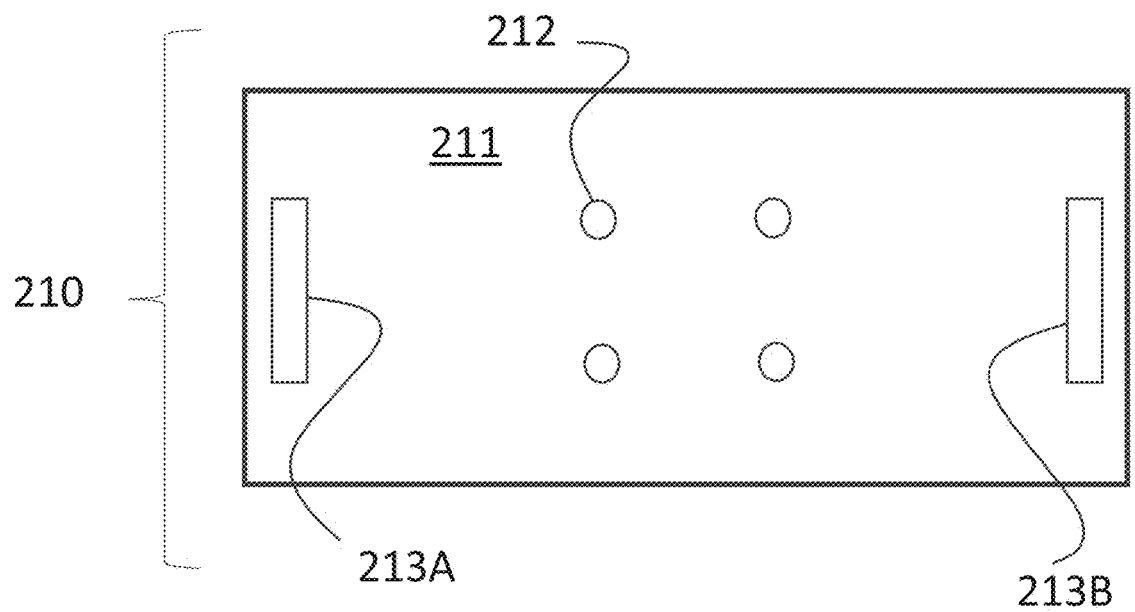
FIG. 3 shows a spin chuck jig of according to an exemplary embodiment of the present inventive concept.
Figure 3:
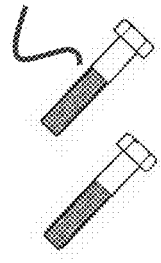
Figure 3:
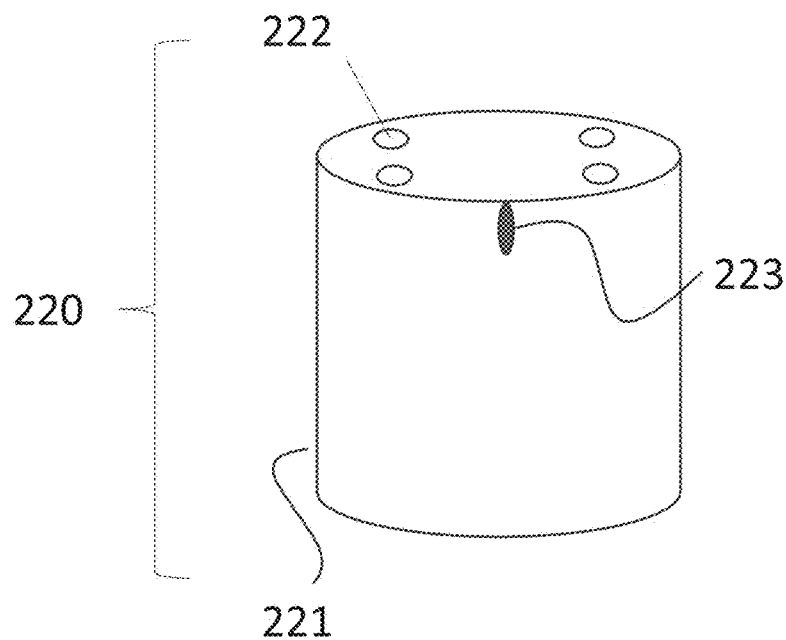

FIG. 3 shows a spin chuck jig of according to an exemplary embodiment of the present inventive concept.

The spin chuck jig 200 includes a handle 210, a base 220 and a plurality of bolts 230.

The handle 210 includes a plate 211 and a plurality of first holes 212. The plate 211 may be shaped of a rectangular sheet. The plate 211 may be formed of acrylic. The plate 211 may have a thickness sufficient to lift the spin chuck 150. The plate 211 may have a length greater than a wafer diameter or a shoulder width of a maintenance engineer so that the engineer can lift ergonomically the spin chuck 150 attached to the spin chuck jig 200.

The first holes 212 penetrate the plate 211 and are arranged symmetrically. For the convenience of a description, the number of first holes 212 is four. The plate 211 may have a different number of holes from the four holes.

The handle 210 further includes a first cut 213A adjacent to an end of the plate 211 and a second cut 213B adjacent to the other end. Maintenance engineers may put their fingers into the first and second cuts 213A and 213B, thereby holding more safely the handle 210 to lift the spin chuck 150. In an exemplary embodiment, the handle 210 need not have the first and second cuts 213A and 213B.

The base 220 includes a body 221 and a plurality of second holes 222. The body 221 may be formed of acrylic. The body 221 may have the same shape as that of the recessed region 152 of the spin chuck 150. For example, the recessed region 152 and the body 221 are cylindrical. The body 221 may have a diameter sufficient to fit into the recessed region 152. For example, the body 221 may be inserted slidingly into the recessed region 152. In this case, maintenance engineers may align the second holes 222 to the bolt receptors 154 by rotating the body 221 in the recessed region 152. Because the body 221 fits into the recessed region 152, small parts may be prevented from accidentally falling into the inside of the single-wafer wet-spin process equipment 100 through the connecting hole 153.

The base 220 further includes a notch 223 that serves to re-establish orientation during installation after completing maintenance.

The bolts 230 may be inserted into the bolt receptors 154 through the first holes 212 and the second holes 222. For example, the bolts 230 each may be inserted into one of the bolt receptors 154 through one of the first holes 212 and one of the second holes 222 aligned to each other. The bolts 230 may be threaded at their ends and the bolt receptors 154 may be threaded on their inside. The bolts 230 may be screwed until the handle 210 and the base 220 are securely attached to the spin chuck 150.

The present inventive concept is not limited thereto. In an exemplary embodiment, the handle 210 and the base 220 may be connected to each other using an epoxy glue.

Figure 4:
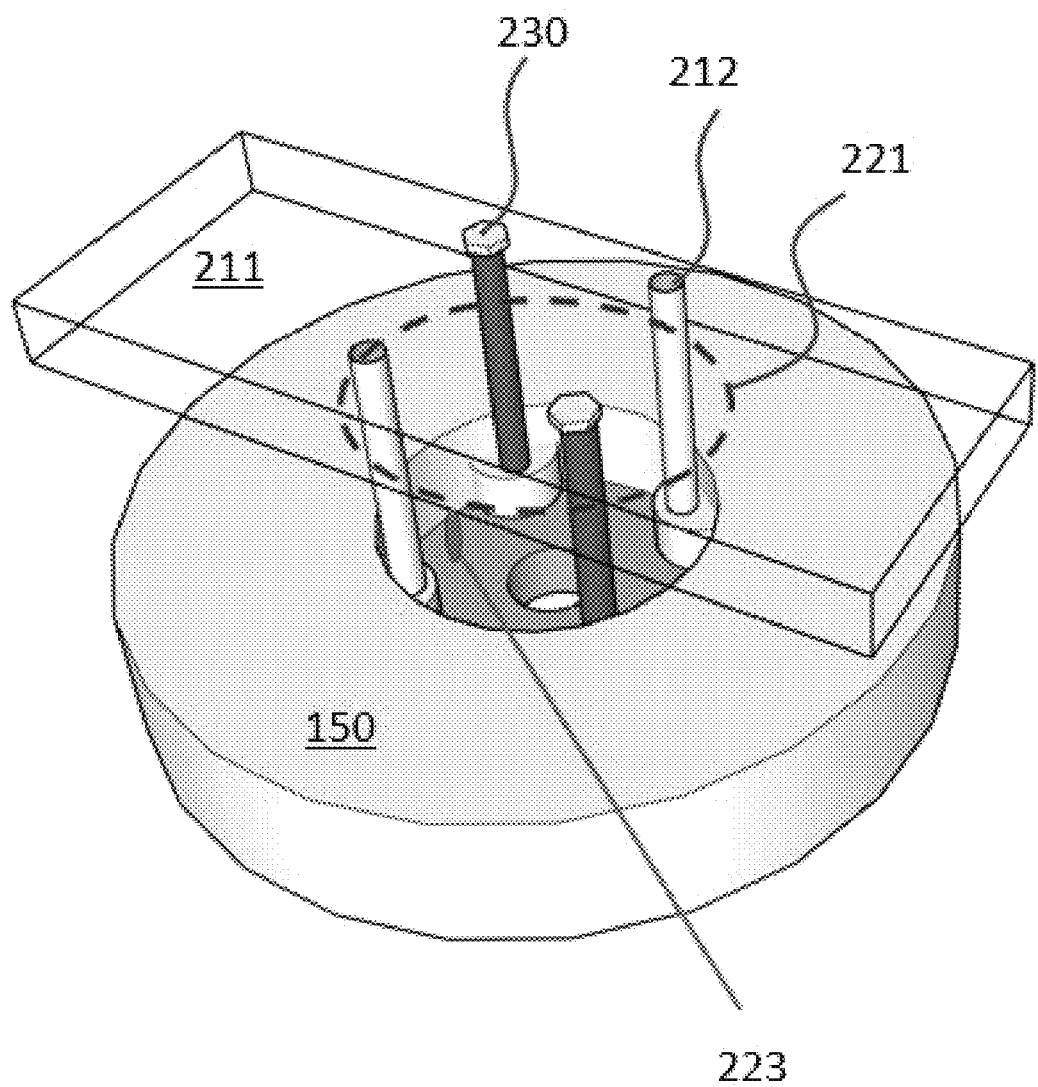
FIG. 4 shows a perspective view of a spin chuck jig attached to a spin chuck of FIG. 1 according to an exemplary embodiment of the present inventive concept.

FIG. 4 shows a perspective view of a spin chuck jig attached to a spin chuck of FIG. 1 according to an exemplary embodiment of the present inventive concept. The spin chuck jig 200 may serve as an ergonomic, force-distributing, and part-protecting device for maintenance engineers. The spin chuck jig 200 may provide a large, graspable handle for two hands secured to a cylinder-shaped base that covers the recessed region 152 to prevent small part intrusion. The notch 223 may be provided to re-establish orientation during installation.

In FIGS. 2, 3 and 4, the base 220 is inserted into the recessed region 152 of the spin chuck 150. A bottom surface of the body 221 may be in contact with the bolt receptors 154. The handle 210 is placed on a top surface of the body 221. The first holes 212 and the second holes 222 are arranged to align with each other so that the bolts 230 are inserted into the bolt receptors 154. For the convenience of a description, two bolts are used to attach the spin chuck jig 200 to the spin chuck 150. In an exemplary embodiment, the two bolts are diagonally faced to each other.

Figure 5A:
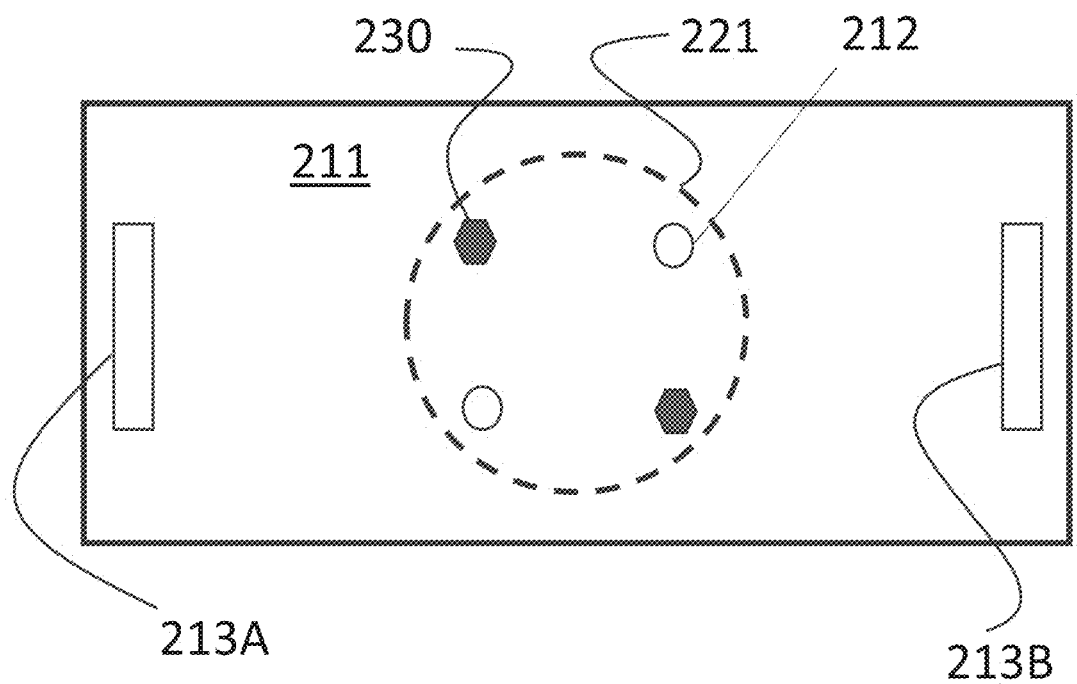
FIG. 5A shows a top view of the spin chuck jig of FIG. 4 according to an exemplary embodiment of the present inventive concept.
Figure 5B:
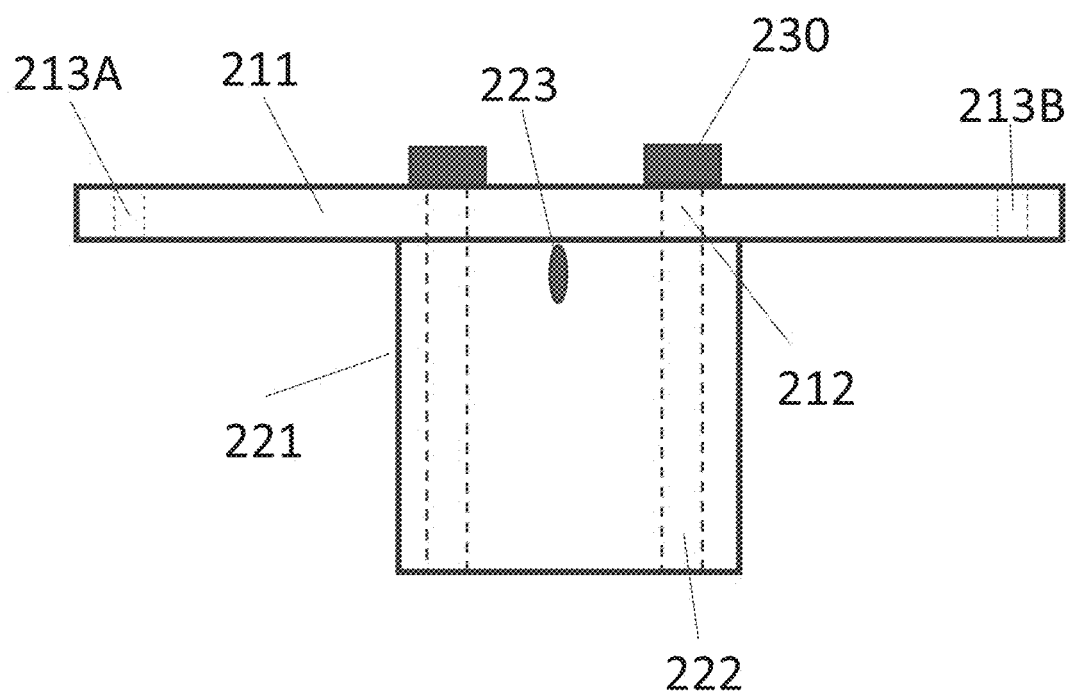
FIG. 5B shows a side view of the spin chuck jig of FIG. 4 according to an exemplary embodiment of the present inventive concept.

FIG. 5A shows a top view of the spin chuck jig 200, attached to the spin chuck 150, of FIG. 4 according to an exemplary embodiment of the present inventive concept. FIG. 5B shows a side view of the spin chuck jig, attached to the spin chuck 150, of FIG. 4 according to an exemplary embodiment of the present inventive concept.

Hereinafter, a method of lifting a spin chuck will be described with reference to FIG. 6 and FIGS. 1 to 4.

Figure 6:
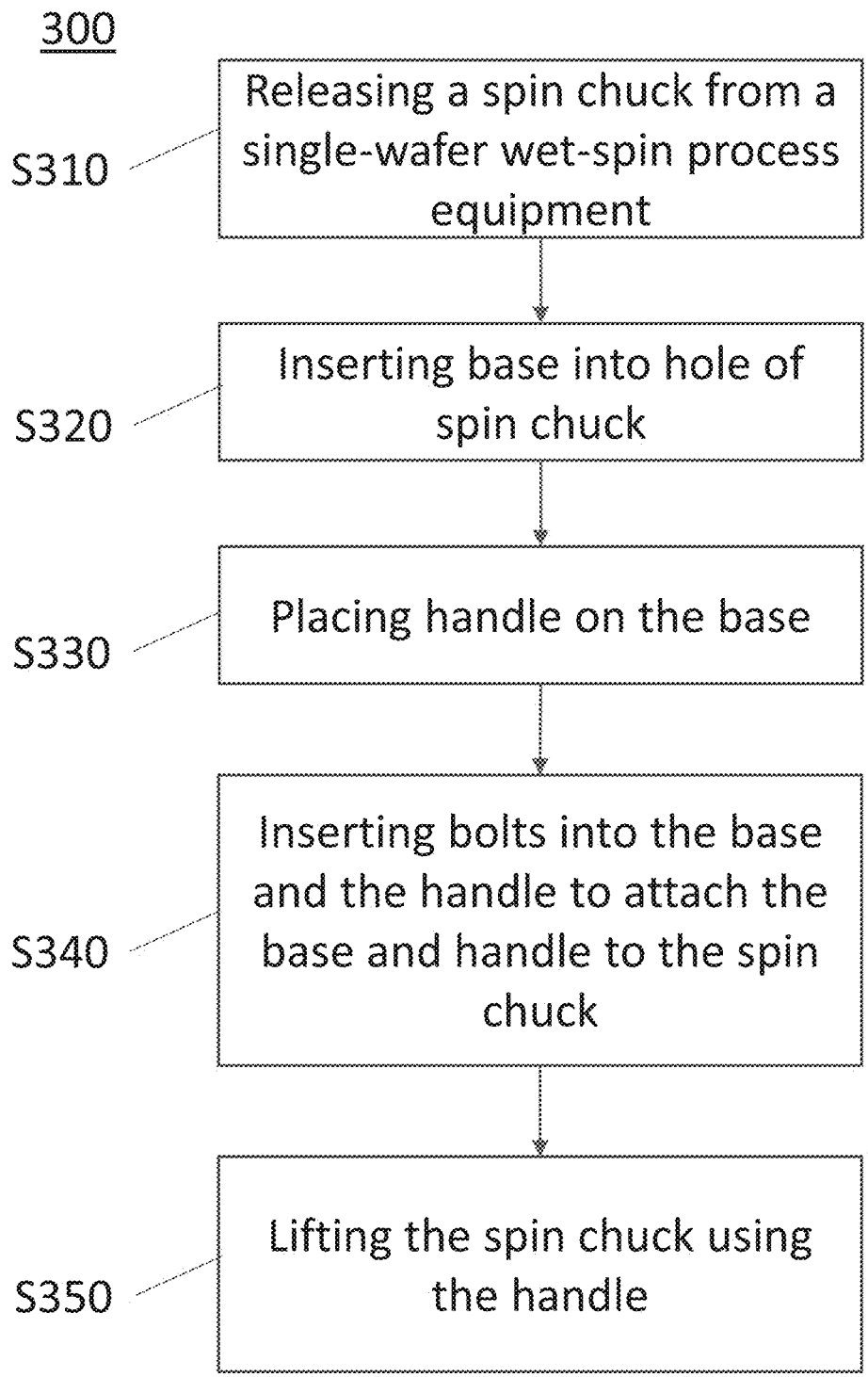
FIG. 6 shows a method of lifting a spin chuck from a single-wafer spin-wet process equipment using a spin chuck jig according to an exemplary embodiment of the present inventive concept.

FIG. 6 shows a method 300 of lifting a spin chuck from a single-wafer wet-spin process equipment using a spin chuck jig according to an exemplary embodiment of the present inventive concept.

In step S310, the spin chuck 150 is released from the rotating shaft 140.

In step S320, the base 220 having the second holes 222 is inserted into the recessed region 152 of the spin chuck 150. When the base 220 is inserted into the recessed region 152, the second holes 222 are aligned to the bolt receptors 154 of the spin chuck 150.

In step S330, the handle 210 having the first holes 212 is placed on a top surface of the base 220. When the handle 210 is placed on the base 220, the first holes 212 are aligned to the second holes 222 of the base 220.

In step S340, each of the bolts 230 is inserted into one of the first holes 212 and one of the second holes 222 aligned to each other so that the base 220 and the handle 210 are attached to the spin chuck 150. In doing so, each of the bolts 230 is inserted into one of the bolt receptors 154 through the one of the first holes 212 and the one of the second holes 222.

In step S350, the spin chuck 150 is lifted using the handle 210.

According to an exemplary embodiment, the spin chuck jig 200 may serve as an ergonomic, force-distributing, and part-protecting device and thus maintenance engineers may avoid mechanical damage and/or personal injury when lifting the spin chuck 150 using the spin chuck jig 200.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A spin chuck jig, for use in lifting a spin chuck from a spin process equipment, the spin chuck comprising a wafer holder at a peripheral area of the spin chuck, a recessed region at a central area of the spin chuck, and a plurality of bolt receptors arranged within the recessed region, the spin chuck jig comprising:
    a handle having a plurality of first holes, wherein a number of the plurality of first holes and a number of the bolt receptors are the same;
    a base having a plurality of second holes, wherein the base is insertable into the recessed region and wherein a number of the plurality of second holes and a number of the plurality of first holes are the same; and
    a plurality of bolts, wherein a length of each of the plurality of bolts is sufficiently long to penetrate one of the plurality of first holes, one of the plurality of second holes and one of the plurality of bolt receptors so that the handle and the base are attachable to the spin chuck.

2. The spin chuck jig of claim 1,
wherein the base is of cylindrical shape.

3. The spin chuck jig of claim 2,
wherein a number of the plurality of first holes is four.

4. The spin chuck jig of claim 1,
wherein a number of the plurality of bolts is two.

5. The spin chuck jig of claim 1,
wherein the handle is shaped of a rectangular sheet.

6. The spin chuck jig of claim 5,
wherein the base is shaped of a cylinder.

7. The spin chuck jig of claim 6,
wherein the handle and the base are formed of acrylic.

8. The spin chuck jig of claim 5,
wherein the handle includes a first cut adjacent to one end of the handle and a second cut adjacent to the other end.

9. The spin chuck jig of claim 1,
wherein the base includes a notch.

10. The spin chuck jig of claim 1,
wherein the handle has a length greater than 450 mm.

* * * * *